(12) United States Patent
Farag et al.

(10) Patent No.: US 12,277,273 B2
(45) Date of Patent: Apr. 15, 2025

(54) MID-AIR ELECTROMAGNETIC-BASED KINESTHETIC HAPTIC DEVICE

(71) Applicants: Mina Maged Micheal Farag, Hengelo (NL); Alaaeldin Adel Mohamed Mahmoud Sadek, Cairo (EG)

(72) Inventors: Mina Maged Micheal Farag, Hengelo (NL); Alaaeldin Adel Mohamed Mahmoud Sadek, Cairo (EG)

( * ) Notice: Subject to any disclaimer, the term of this patent is extended or adjusted under 35 U.S.C. 154(b) by 0 days.

(21) Appl. No.: 18/236,057

(22) Filed: Aug. 21, 2023

(65) Prior Publication Data

US 2024/0069638 A1 Feb. 29, 2024

(51) Int. Cl.
*G06F 3/01* (2006.01)
*G06F 3/0346* (2013.01)
(Continued)

(52) U.S. Cl.
CPC .............. *G06F 3/016* (2013.01); *G06F 3/014* (2013.01); *G06F 3/0346* (2013.01);
(Continued)

(58) Field of Classification Search
CPC .......... G06F 3/016; G06F 3/011; G06F 3/014; G06F 2203/014; G06F 2203/013; G06F 2203/0331; G06F 2203/0335; G08B 6/00; B60K 35/25; H01H 2003/008; H01H 13/85; H01H 2215/00; A63F 2300/1037; H03K 2217/96062; B25J 13/025; B25J 13/084;
(Continued)

(56) References Cited

U.S. PATENT DOCUMENTS 10,558,267 B2 * 2/2020 Khoshkava ............. G06F 3/011
2006/0209019 A1 * 9/2006 Hu ......................... G06F 3/016
345/156

FOREIGN PATENT DOCUMENTS

CN 115705953 A * 2/2023 ......... F16K 31/0675
EP 3766599 A1 * 1/2021 ........... B22D 11/115

OTHER PUBLICATIONS

A. Adel, M. M. Micheal, M. A. Self, S. Abdennadher and I. S. M. Khalil, "Rendering of Virtual Volumetric Shapes Using an Electromagnetic-Based Haptic Interface," 2018 IEEE/RSJ International Conference on Intelligent Robots and Systems (IROS), Madrid, Spain, 2018, pp. 1-9, (Year: 2018).*

(Continued)

*Primary Examiner* — Koosha Sharifi-Tafreshi

(57) ABSTRACT

Disclosed in the present invention is an electromagnetic-based haptic device that utilizes a flat wire coil type to provide the user with kinesthetic feedback in mid-air without direct contact. The invention comprises an array of flat wire coils, a localization system, a cooling fluid source, a magnetic agent attached to a stylus or a wearable device, current drivers and computer software. The flat wire coil comprises longitudinal packed flat conductive turns, each two turns are separated by an axial air gap. The cooling fluid source generates a fluid flow to pass over the surfaces of the coils to dissipate the heat generated by the device during the operation. The array of flat-wire coils is used to generate controlled magnetic fields and magnetic field gradients at a point in the workspace, the magnetic agent is attached to a wearable device or a handhold stylus to translate the magnetic fields/magnetic fields gradients to forces/torques feedback and thus haptic sensation.

14 Claims, 5 Drawing Sheets

(51) Int. Cl.
      *G06F 3/0354*       (2013.01)
      *H02K 3/24*         (2006.01)
      *H02K 33/18*        (2006.01)

(52) U.S. Cl.
      CPC ........... *G06F 3/03545* (2013.01); *H02K 3/24*
              (2013.01); *H02K 33/18* (2013.01)

(58) Field of Classification Search
      CPC .......... G01C 21/3652; G10H 2220/311; A61B
              2018/00297; A61B 34/76; A61B 5/7455;
              G05D 1/005; G05B 2219/40619; G05B
              2219/40122; G05B 2219/37396; B60Y
              2400/902; G03H 2001/0061; G09B
              21/003; G09B 21/004; G09B 21/007;
              B60W 50/16; A63B 2071/0655; A61M
              2205/582; A61M 2021/0022; A61H
              2003/063
      USPC ............................... 340/407.1; 715/701–702
      See application file for complete search history.

(56) References Cited

OTHER PUBLICATIONS

A. Adel, M. Mansour, M. M. Micheal, A. Abdelmawla, I. S. M. Khalil and S. Misra, "Magnetic Localization for an Electromagnetic-Based Haptic Interface," in IEEE Magnetics Letters, vol. 10, pp. 1-5, 2019, Art No. 2102705, doi: 10.1109/LMAG.2019.2908149. (Year: 2019).*

* cited by examiner

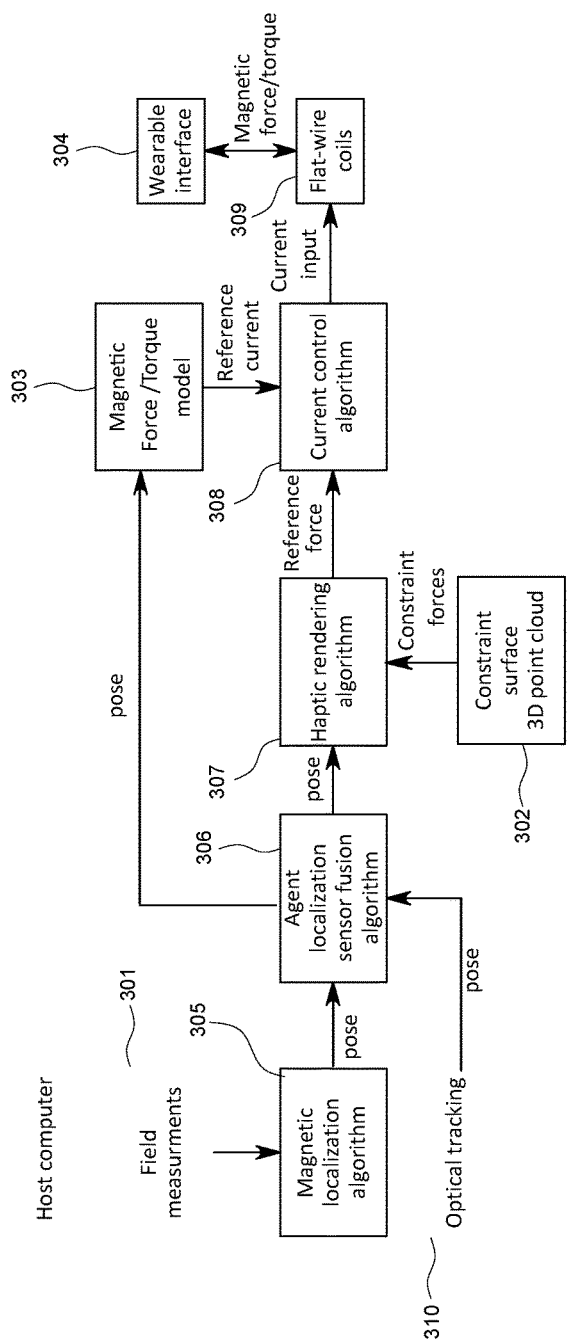
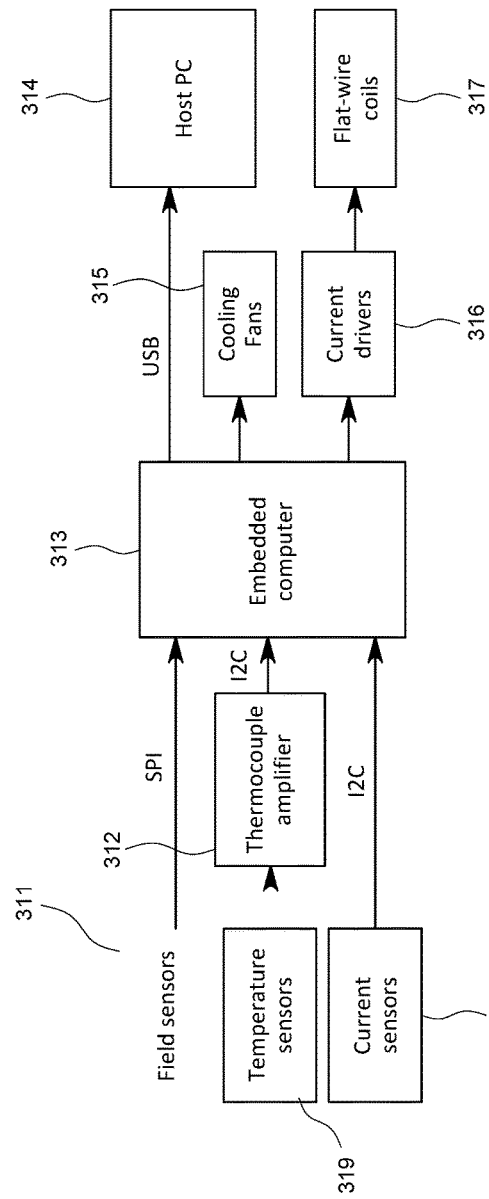
FIG. 3A
FIG. 3B

MID-AIR ELECTROMAGNETIC-BASED KINESTHETIC HAPTIC DEVICE

TECHNICAL FIELD

The present invention generally, relates to robotics, haptic, human-computer interaction and in particular to a mid-air electromagnetic-based kinesthetic haptic device to provide the user with the sense of touch of computer-generated virtual objects.

BACKGROUND ART

Haptic technology aims to provide the user with the sense of touch of computer-generated virtual objects. In the last years, there has been considerable progress in this technology owing to its potential in several applications such as medical simulation training, robotics, teleoperation, education, video gaming industry, rehabilitation, interactive design and human-computer interaction (HCI) applications. Moreover, the recent advancements in augmented/virtual reality (AR/VR) technologies enhance the development of haptic techniques and devices.

Haptic devices and systems can be classified based on the trigger mechanism into kinesthetic and tactile devices. The kinesthetic devices are n-degrees of freedom (DOF) serial manipulator-like devices that allow the user to push on them and be pushed back, these exchanges of forces and motion provide haptic feedback to the user. This type is classified into three categories; manipulandum (grounded devices with 3 to 6 DOF), grasp (simulates grasping interactions at the user's hand or fingers) and exoskeleton (grounded on the body, providing forces on natural DOF of the body).

There are several kinesthetic devices available in the market such as Touch and Phantom Premium (3D Systems Corporation, South Carolina, United States), Omega and Delta (Force Dimensions, Nyon, Switzerland) and several other devices. These devices provide a wide range of forces with an order of Newtons. Moreover, these devices have relatively high spatial and temporal resolutions.

These kinesthetic haptic devices are capable of providing the user with a wide stiffness range during interaction which plays a crucial role in medical simulators and training applications However, these devices suffer from several drawbacks such as friction, backlash, inertia and singularities of the manipulators. In addition, they do not provide the user with sufficient realism during the interaction with virtual objects due to the transmission of forces using tethered links.

In the tactile type, the haptic sensation is created by stimulating the receptors located in the skin. This type is classified into three categories; cutaneous (haptic on the user's skin), active surfaces (programmable haptic effects on the physical surface) and mid-air (tactile feedback without contact).

Recently, the mid-air haptic type has gained huge interest due to its suitability for the AR/VR ecosystems. Several groups have investigated different techniques such as acoustics radiation pressure, air-jet, air-vortex, lasers and magnetic fields to achieve haptic feedback without direct contact. Ultraleap (formerly Ultrahaptics) creates the tactile sensation by using ultrasound transducers which provide acoustic radiation pressure at the user hand skin. However, the ultrasound-based tactile haptic devices are not capable of generating the adequate range of forces or torques kinesthetic haptic devices can provide. Ultrasound-based tactile devices provide only limited values of force with an order of few Millinewtons. This drawback prevents haptic rendering of virtual objects with a practical range of controllable stiffness such as soft tissues and organs and limits the use of that haptic rendering technique in medical applications.

Using magnetic fields to provide haptic feedback has obtained considerable research attention in recent years, this technique has proven its ability to provide mid-air haptic feedback with a range of forces/torques similar to that of the kinesthetic devices. To date, there are no mid-air electromagnetic-based haptic devices available in the market with the force range and update rate similar to that of the kinesthetic devices.

The absence of such a device decelerates the development of haptic methods and applications using mid-air magnetic rendering technology, moreover it limits its accessibility only for those who can develop this kind of systems. For comparison, the research articles in the field of mid-air ultrasound-based haptic techniques and applications have gained an immense leap as a result of the availability of Ultraleap haptic devices. The availability of an electromagnetic-based haptic device will benefit both researchers and developers in these areas and applications.

The development of a mid-air electromagnetic-based kinesthetic haptic devices has met a number of challenges, including thermal load, update rate, spatial and temporal resolution of the device. The other shortcoming is how to achieve multi-point haptic interaction in mid-air.

For instance, there is a need to provide a device that would keep the temperature of the electromagnetic system within a safe range during the operation. Traditional electromagnets suffer from this drawback and require to be attached to extended surfaces (fins) to dissipate the power losses using convection. Adding heat sinks to the electromagnetic system affects the form factor of the system as the heat sinks do not contribute to the generation of the magnetic fields/forces.

The challenge associated with achieving a relatively high update rate for the electromagnetic system similar to that of the available kinesthetic haptic devices in the market (from a few hundred hertz to several kilohertz). Achieving high update rates is crucial to the stability of the haptic interaction, traditional electromagnets with a ferromagnetic core and multilayer wires have high time constant and thus low update rate.

The temporal and spatial resolutions of the localization systems integrated with the haptic devices play a crucial role in the stability of the haptic interaction process. The robotic-based kinesthetic devices available in the market utilizes a high accuracy localization system with average positional error of a few tens of micrometres and an update rate of a few hundred hertz. These devices use high resolutions encoders connected to the rotatory joint of these robotic-based devices. However, applying this method to mid-air devices is not possible due to the contactless interaction between the user and the haptic device. Optical-based localization systems with high spatial and temporal resolution similar to that of the kinaesthetic devices are very expensive and require special conditions during the operation, these drawbacks limit the accessibility of the haptic devices incorporating optical tracking to a wide range of users.

The US patent number US20060209019A1 of 1 Mar. 2004 discloses a magnetic haptic feedback systems and methods for virtual reality environments. The haptic feedback system comprises a moveable device with at least three degrees of freedom in an operating space. A display device is operative to present a dynamic virtual environment. A controller is operative to generate display signals to the display device for presentation of a dynamic virtual environment corresponding to the operating space, including an icon corresponding to the position of the moveable device in the virtual environment. An actuator of the haptic feedback system comprises a stator having an array of independently controllable electromagnet coils. By selectively energizing at least a subset of the electromagnetic coils, the stator generates a net magnetic force on the moveable device in the operating space. In certain exemplary embodiments the actuator has a controllably moveable stage positioning the stator in response to movement of the moveable device, resulting in a larger operating area. A detector of the system, optionally multiple sensors of different types, is operative to detect at least the position of the moveable device in the operating space and to generate corresponding detection signals to the controller. The controller receives and processes detection signals from the detection sensor and generates corresponding control signals to the actuator to control the net magnetic force on the moveable device. However, although this prior art doesn't provide a mid-air haptic sensation with characterization similar to that of the kinesthetic haptic devices.

The other prior art US patent is U.S. Pat. No. 8,497,767B2 of 2 Mar. 2009 which describes a magnetic levitation haptic interface system. This invention discloses a haptic interface system that uses Lorentz forces to provide magnetic levitation for a handle which can be manipulated by a person, typically a computer user. However, the feature of a mid-air electromagnetic-based haptic interaction is not claimed in this prior art.

A non-patent prior art published by A. Adel et al, 2018 have demonstrated a rendering of volumetric shapes using an electromagnetic-based haptic system, in Proceedings of the IEEE International Conference on Intelligent Robots and Systems (IROS), pp. 8737-8742, Madrid, Spain. In that work, they developed an electromagnetic-based haptic interface to provide controlled magnetic forces on a wearable orthopedic finger splint with a single magnetic dipole. They modeled the electromagnetic forces exerted on the finger splint, optimize the design of the electromagnetic coils, and develop an impedance-type haptic rendering algorithm using position feedback. This rendering algorithm capitalizes on minimizing the error between the exerted magnetic force and the desired constraint force of a virtual three-dimensional (3D) object based on the position of the finger splint.

Lastly, Alaa Adel et al, 2019 teaches of a magnetic localization for an electromagnetic-based haptic interface, in IEEE Magnetics Letter, vol. 10, 2102705, March 2019. In this prior art, the authors developed a magnetic localization system for an Electromagnetic-Based Haptic Interface (EHI). Haptic interaction is achieved using a controlled magnetic force applied via an EHI on a magnetic dipole attached to a wearable finger splint. The position of the magnetic dipole is estimated using two identical arrays of three-dimensional magnetic field sensors in order to eliminate the magnetic field generated by the EHI. The measurements of these arrays are used to estimate the position of the magnetic dipole by an artificial neural network. This network maps the field readings to the position of the magnetic dipole.

OBJECT OF THE INVENTION

The main object of the present invention is to develop a thermally stable and high update rate kinesthetic haptic device that provides the user with the sense of touch of computer-generated virtual objects in mid-air.

SUMMARY OF THE INVENTION

Disclosed in the present invention is an electromagnetic-based haptic device that utilizes a flat wire coil type to provide the user with kinesthetic feedback in mid-air without direct contact. The haptic feedback is achieved by applying controlled magnetic forces/torques on a to a magnetic agent attached wearable interface or a stylus held by the user.

The invention comprises an array of flat wire coils, magnetic localization system, a cooling fluid source, a magnetic agent attached to a stylus or a wearable device, current controllers and a computer software.

Each flat wire coil is formed around a ferromagnetic or a paramagnetic core. This coil comprises longitudinal packed flat conductive turns, each two turns are separated by an axial air gap. the cooling fluid source generates a fluid flow that pass over the surfaces of the coils to dissipate the heat generated by coils of the electromagnetic-based kinesthetic haptic device during the operation.

The array of flat wire coils is used to generate controlled magnetic fields and magnetic field gradients at a point in the workspace, a magnetic agent is attached to a wearable device or a handhold stylus to translate the magnetic fields/magnetic fields gradients to magnetic forces/torques and thus haptic sensation.

A magnetic localization system is used to provide the position and orientation of the magnetic agent.

The current drivers are used to supply the coils with the required electrical current. Finally, the computer software is used to connect all of the device components.

BRIEF DESCRIPTION OF FIGURES

FIG. 2B shows the position of the lower field sensors board with respect to the coils.

FIG. 3A illustrate the rendering software components running on the host computer.

FIG. 3B illustrates a block diagram of the internal hardware architecture of the haptic device.

DETAILED DESCRIPTION OF THE INVENTION

Figure 1A:
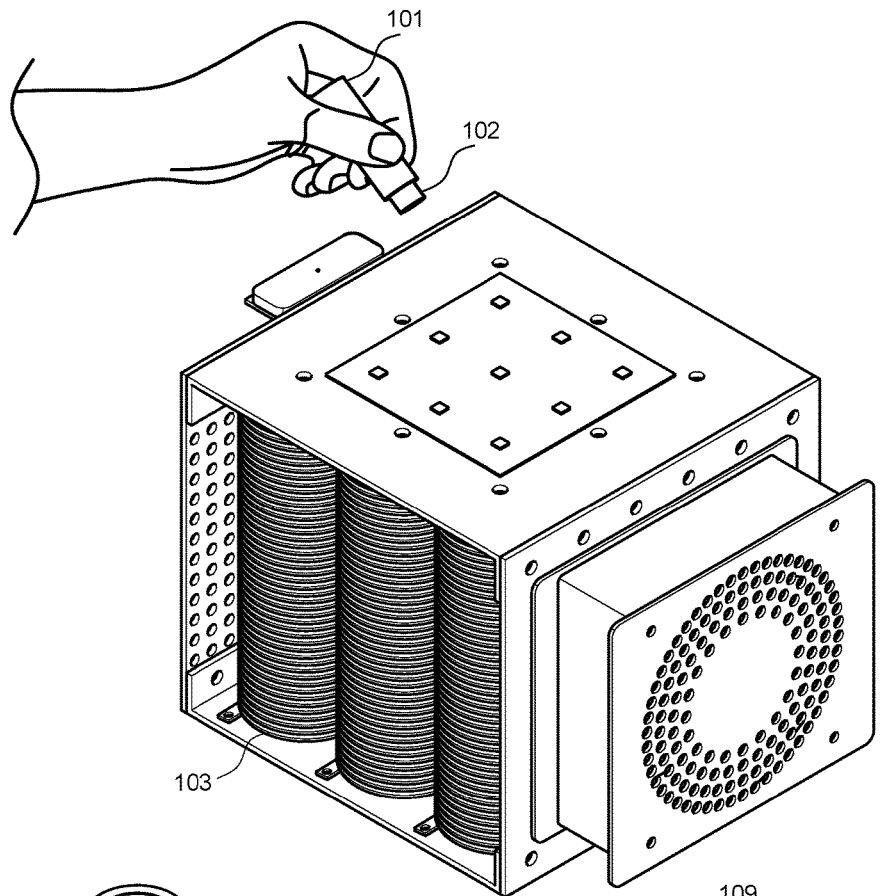
FIG. 1A is an isometric view of the haptic device as described in the present invention.

The following description is presented to enable any person skilled in the art to make and use the invention as claimed and is provided in the context of the particular examples discussed below, variations of which will be readily apparent to those skilled in the art. In the interest of clarity, not all features of an actual implementation are described in this specification. It will be appreciated that in the development of any such actual implementation (as in any development project), design decisions must be made to achieve the designers' specific goals (e.g., compliance with system- and business-related constraints) and that these goals will vary from one implementation to another.

The invention comprises an array of flat wire coils, a localization system, a cooling fluid source, a magnetic agent attached to a stylus or a wearable device, current controllers and computer software.

Each flat wire coil is formed around a ferromagnetic or a paramagnetic core. This coil comprises longitudinal packed flat conductive turns, each two turns are separated by an axial air gap. The cooling fluid source generates a fluid flow to pass over the surface of the coils to dissipate the heat generated by the coils of the haptic device during the operation. Using this type of coils eliminates the usage of an additional heat sink to dissipate the heat generated by the coils during the operation.

In the case of using air fans as a cooling fluid source in proximity to the coils, the air fans' electrical motors are affected by the magnetic fields generated by the coils. A magnetic shielding structure is used to decrease the fields generated by the coils at the air fan motors to safe limits (less than 1 mTesla). The shielding structure can be manufactured from a ferromagnetic material with a high magnetic permeability such as Mu-metal.

The flat wire coil type has fewer turns compared to the multi-layer round wires coil due to its ability to carry more electrical current. A significant reduction in coil inductance occurs with a decrease in the number of turns, as the inductance is directly proportional to the square of the number of turns. Moreover, the flat coil has relatively lower electrical resistance compared to the multi-layer round wires coil. Relatively low values of electric inductance and resistance decrease the system time constant and thus the electric voltage needed to achieve the required current consumption at a relatively high update rate. In this type, the relatively low voltage range (<50 V (AC) and <120 V (DC)) is sufficient to supply the coil with relatively high current at an update rate of (500:1000 Hz). Utilizing a flat wire coil type allows achieving an update rate adequate for haptic rendering applications.

An array of flat wire coils is used to generate controlled magnetic fields/magnetic field gradients at a point in the workspace, a magnetic agent is attached to a wearable device or a handhold stylus to translate the magnetic fields/magnetic fields gradients to forces/torques feedback thus haptic sensation.

In the following, the development of the magnetic field and torque model will be described. Magnetic fields are generated using an in-plane array of electromagnetic coils. The goal is to exert controlled magnetic force on a single magnetic dipole moment ($m \in R^{3 \times 1}$) attached to a wearable magnetic material using a controlled magnetic field $B(p) \in R^{3 \times 1}$. Let $p \in R^{3 \times 1}$ be the position of the permanent magnet attached to the finger. If a controlled magnetic field is applied using a configuration of a planar array of n-electromagnetic coils then a magnetic force ($F \in R^{3 \times 1}$) and torque ($\tau \in R^{3 \times 1}$) is generated and is given by $$F = \nabla(B(p) \cdot m),$$

$$\tau = m \times B(p).$$

Equation (equation 1) can be rearranged and the components of the dipole are factored out linearly.

The magnetic force can be written as $$F = \mathcal{F}(m)G(p),$$

herein, $$\mathcal{F}(m) = \begin{bmatrix} m_x & m_y & m_z & 0 & 0 \\ 0 & m_x & 0 & m_y & m_z \\ -m_z & 0 & m_x & -m_z & m_y \end{bmatrix},$$

$$G(p) = \begin{bmatrix} \frac{\partial B_x}{\partial x} & \frac{\partial B_x}{\partial y} & \frac{\partial B_x}{\partial z} & \frac{\partial B_y}{\partial y} & \frac{\partial B_y}{\partial z} \end{bmatrix}^T$$

The magnitude of this magnetic field and its gradient at any given position p of the dipole moment varies linearly with the current through the electromagnet. The linear mapping between the generated magnetic force, torque and the applied current can be represented by $$\begin{bmatrix} \tau_{req} \\ F_{req} \end{bmatrix} = \begin{bmatrix} Skew(m) & \mathbb{O} \\ \mathbb{O} & \mathcal{F}(m) \end{bmatrix} \begin{bmatrix} \tilde{B}(p) \\ \tilde{G}(p) \end{bmatrix} I_{ref}.$$

Herein, $\tilde{B}(p)$ and $\tilde{G}(p)$ is the magnetic field and magnetic field gradient current mapping at a point p, $\mathbb{O}$ is an appropriately sized matrix of zeros, and $I_{ref} \in R^{n \times 1}$ is the applied reference input current vector.

The invention contains an embedded magnetic localization system that provides the pose of the magnetic agent in mid-air with a high degree of precision. The user of the present invention can use different sizes and shapes of the wearable magnetic agent with the ability to change its location on the user's hand.

The current drivers are used to supply the coils with required electrical currents and may be equipped with current sensors to monitor and control the supplied current during operation.

The computer software comprises: A magnetic localization algorithm that uses the measurements of the magnetic field sensors to estimate the pose (3d position and 3d orientation) of the magnetic agent(s). The data of the estimated pose of the agents can be fused with the pose estimated using the optical tracking algorithm for better pose estimation accuracy; a haptic rendering algorithm that employs the geometry of the shape to be rendered and the estimated pose of the agent to calculate the forces required to render a the virtual object in mid-air; a current control algorithm that uses the shape-dependent field-current map of the flat-wire coils as well as the estimated pose of the magnetic agent(s) to calculate the input currents to the flat wire coils.

In some embodiments, the magnetic agent is a permanent magnet, an electromagnet, or a combination of both permeant magnets and electromagnets.

In some embodiments, the magnetic agent is rigid. In other embodiments, the magnetic agent is flexible.

In some embodiments, the magnetic agent is attached to a wearable finger splint or a stylus depending on the preferred way of interaction for the user/operator.

In some embodiments, the magnetic agent can be fixed to the stylus. In other embodiments, the magnetic agent can have some degree of freedom to rotate around one or two axes. For instance, if the magnet is attached to the stylus and can rotate around the stylus central axis using a small wheel or any preferred mechanical way, this rotation can be translated to a specific command such as zoom in/out or rotate a 3D object in the virtual environment.

In some embodiments, the array of the flat wire coils is fixed. In other embodiments, the array of the flat wire coils is moveable.

In some embodiments, the array of flat wire coils can be formed in a planner configuration. In other embodiments, the array of flat wire coils can be formed in a non-planner configuration.

In some embodiments, the flat wire coil contains a single layer of conductive turns. In other embodiments, the flat wire coil contains multi-layers of conductive turns.

The modular configuration feature gives the ability to combine multiple haptic devices to provide haptic interaction at multiple points in the common workspace of the devices. This feature is implemented without any modifications to the hardware but the software of the device. Each device represents a unit cell and provides magnetic forces/torques on a single magnetic agent located on the operating workspace so that the combination of the cells enables the user to achieve multi-point haptic interaction over an extended workspace.

Multiple point haptic feedback effect can be achieved by utilizing one electromagnetic-based haptic device with a relatively high update rate and/or magnetic agent(s) with variable/controllable or constant magnetic field attached to a wearable interface or a hand-held device (e.g. stylus). This effect can be achieved using high-frequency current control of the haptic device's coils and/or the magnetic agent(s). The following paragraphs are dedicated to providing details of the present invention.

Referring to FIG. 1A, the present invention provides a haptic device consisting of an array of flat wire coils (at least eight coils in planner configuration) 103, a magnetic agent 102 attached to an application specific tool (stylus) 101 or a wearable device, air fan(s) as a cooling fluid source 103, magnetic shielding structure, localization system, current drivers and computer software.

Figure 1B:
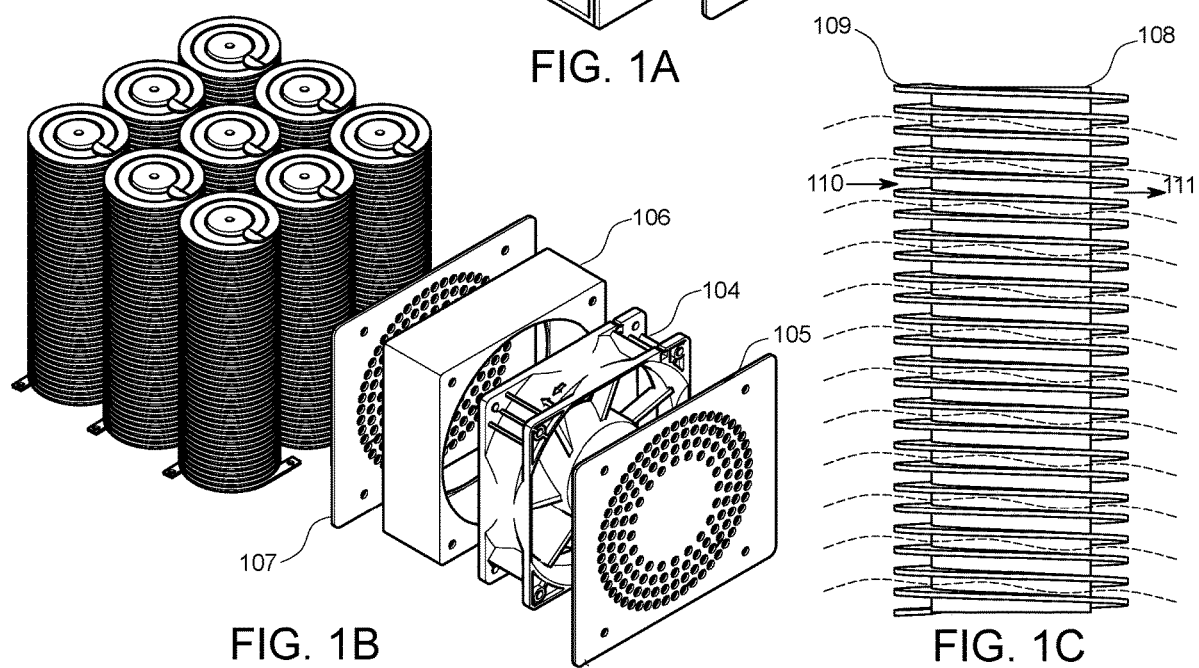
FIG. 1B shows an air fan as a cooling fluid source shielded from the ambient magnetic field.

FIG. 1B shows an air fan 104 as a cooling fluid source and a magnetic shielding structure consisting of three mechanical parts 105, 106 and 107. The shielding structure is manufactured from a ferromagnetic material with a high magnetic permeability such as Mu-metal. It is used to reduce the fields generated by the coils at position of the fan motors to less than 1 mTesla.

Figure 1C:
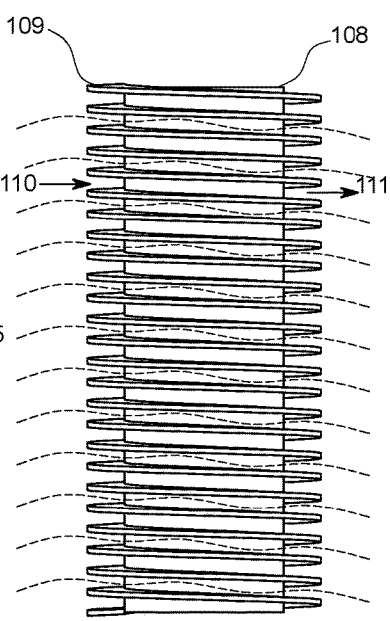
FIG. 1C shows the geometry of the flat wire coil.

In FIG. 1C, each electromagnetic coil is a flat wire type 109 and formed around a ferromagnetic or a paramagnetic core 108. An airflow 110, 111 passes over the surfaces of the flat wire and provides direct cooling of the coil during the operation. The total surface area of the flat wire coil is larger than that of the typically used multi-layer round wires coil electromagnets multiple times depending on the dimensions of the flat wire coil. The air flow through the air gap between turns increases the heat transfer coefficient thus increasing the heat dissipation rate.

Figure 2A:
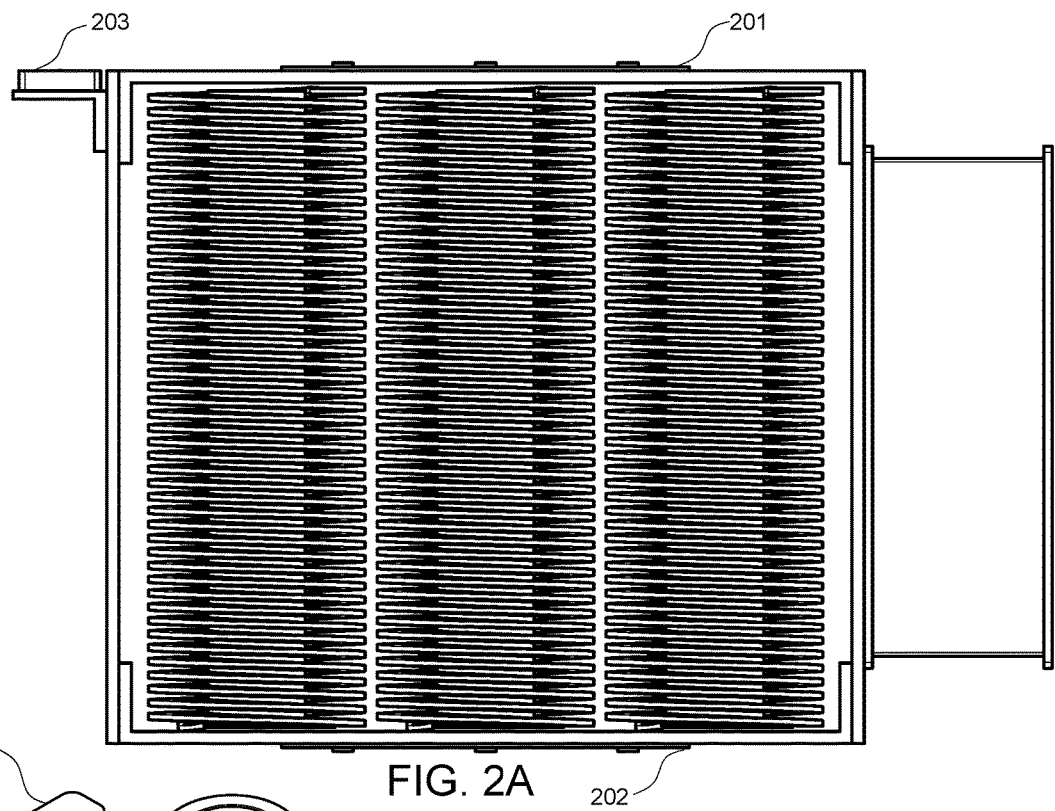
FIG. 2A shows the localization system.
Figure 2B:
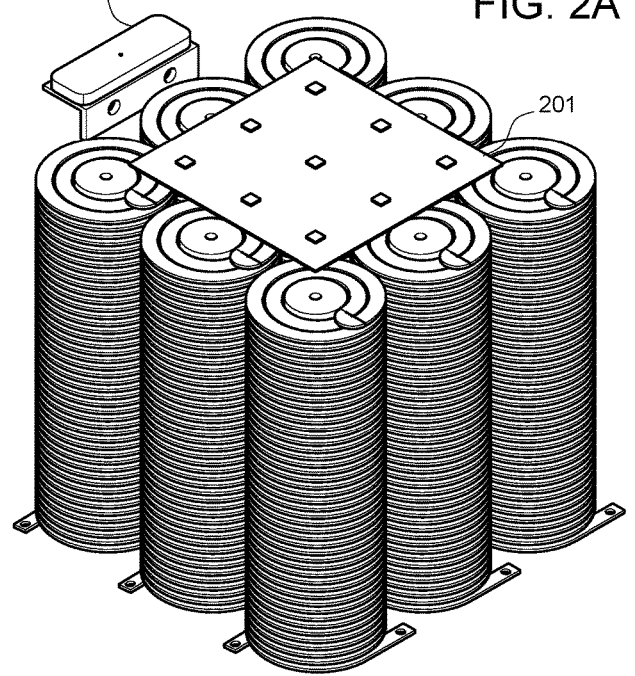
FIG. 2B shows the position of the upper field sensors board with respect to the coils.
Figure 2C:
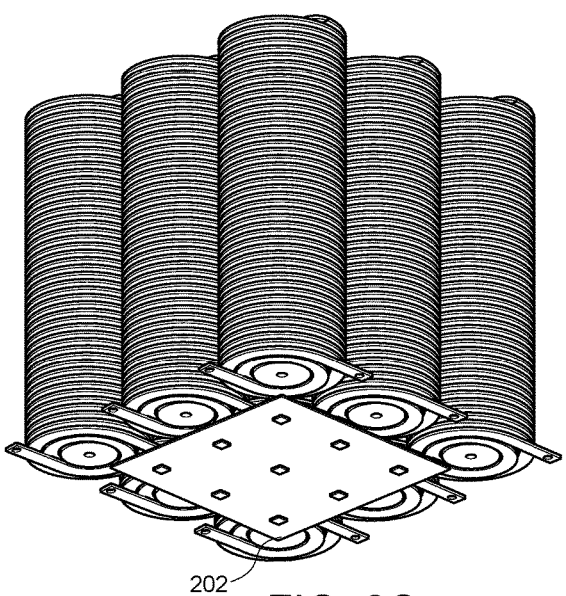

The localization system consists of two arrays of three-dimensional (3-D) magnetic field sensor boards 201 and 202 and an optical localization system 203. These arrays are mounted above and below the flat wire coils, as shown in FIGS. 2A, 2B and 2C. The subtraction of the magnetic field between these two arrays provides the field generated by the magnetic agent. This field is used to estimate the position and the orientation of the agent by an artificial neural network, a non-linear optimization technique or any suitable estimation technique.

Referring to FIG. 3A, a method for controlling magnetic force and torque applied to the magnetic agent as described is disclosed. The method includes computer software comprising, a magnetic localization algorithm 305 that uses the real-time magnetic field measurements 301 obtained using at least two arrays of three dimensional Hall-sensors to estimate the three dimensional position and three dimensional orientation of the magnetic agent(s); a localization sensor fusion algorithm 306 is utilized to fuse the position and orientation data of the magnetic localization algorithm 305 with the position and orientation data from the optical tracking algorithm 310 to achieve higher estimation accuracy of the magnetic agent(s); a haptic rendering algorithm 307 that employs the constraint surface forces 3D point cloud of the shape to be rendered 302 and the estimated pose of the agent to calculate the reference forces required to render a virtual (volumetric) object in mid-air; The method further includes, based on the above described models and equations, providing a model of the three dimensional magnetic force and torque 303 applied on a magnetic haptic agent using the array of electromagnetic coils. The provided model also takes in accounts mutual inductance from the surrounding coils within the array. Based on the model, feedback from the magnetic tracking algorithm and the current sensors is provided to the current control algorithm 308. A force (closed-loop) control algorithm is utilized to control the magnetic forces applied to the magnetic agent using a three dimensional force/torque sensor attached to the magnetic agent. The input currents to the flat-wire coils 309 is adjusted in accordance with the provided feedback. These steps of the method may be performed repeatedly and/or continuously during the operation of the haptic device.

In FIG. 3B, a block diagram of the internal hardware architecture comprising, magnetic field sensors 311 to measure the magnetic field of the magnetic agent(s); temperature sensors 319 and thermocouple amplifiers 312 to measure the temperature of the flat wire coils 317; current sensors 318 to measure the currents on the flat-wire coils 317; cooling fans 315 to dissipate the heat generated by the flat-wire coils 317; current drivers 316 to control the currents into the flat-wire coils 317; an embedded computer 313 is connected to the sensors, cooling fans and current drivers for data-acquisition and current control; a host computer 314 communicates with the embedded computer through Universal Serial Bus (USB).

Figure 4:
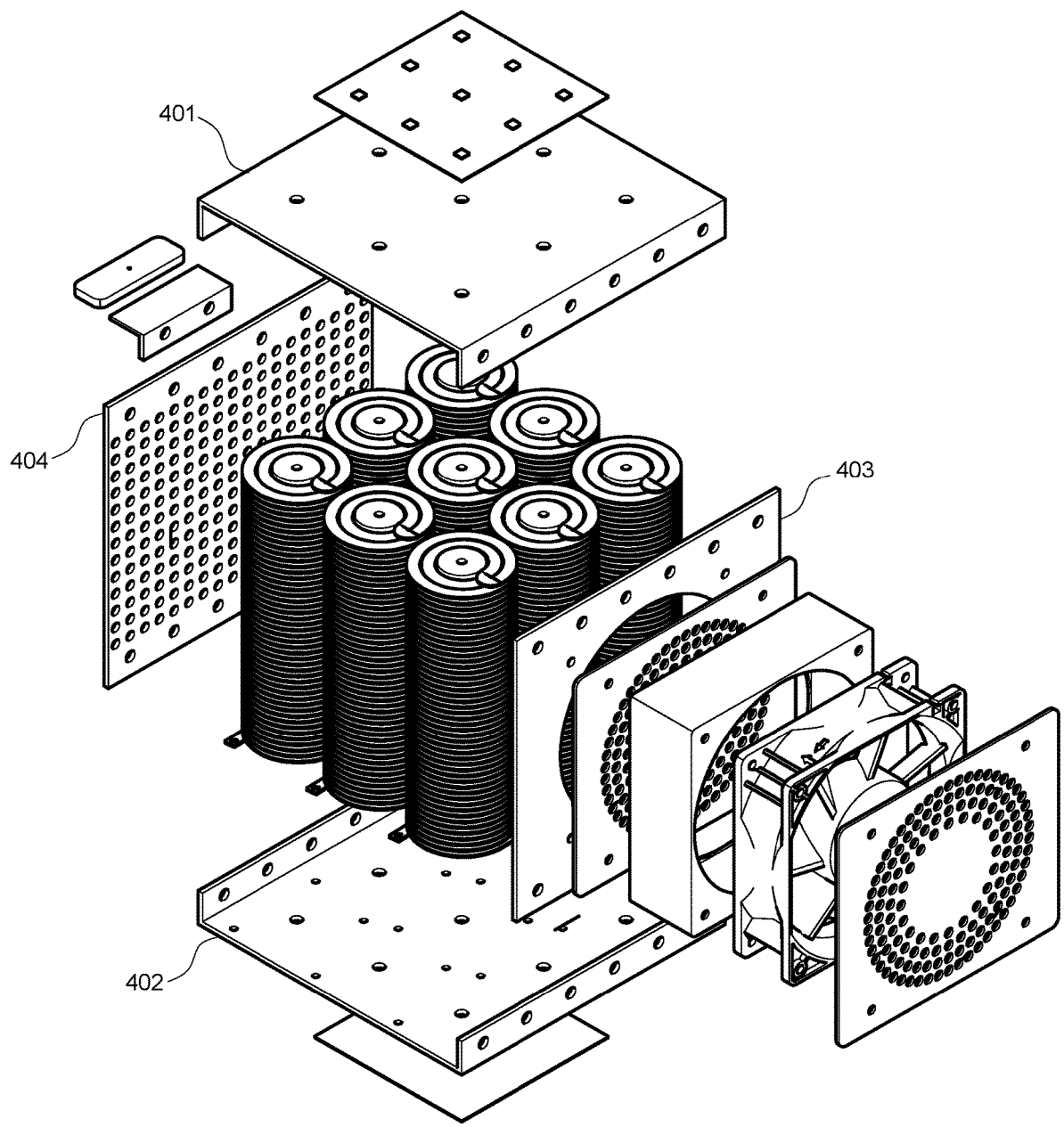
FIG. 4 is an exploded view of the haptic device.

FIG. 4 shows an exploded view of the haptic device, at least two rigid parts 401 and 402 are required to ensure that all centre axis of coils 103 are perfectly parallel to each other. An additional part 403 is used for the mounting of the air fan and shielding structure. Another part 404 is required for the mounting of the optical localization device and any other external sensor.

Figure 5:
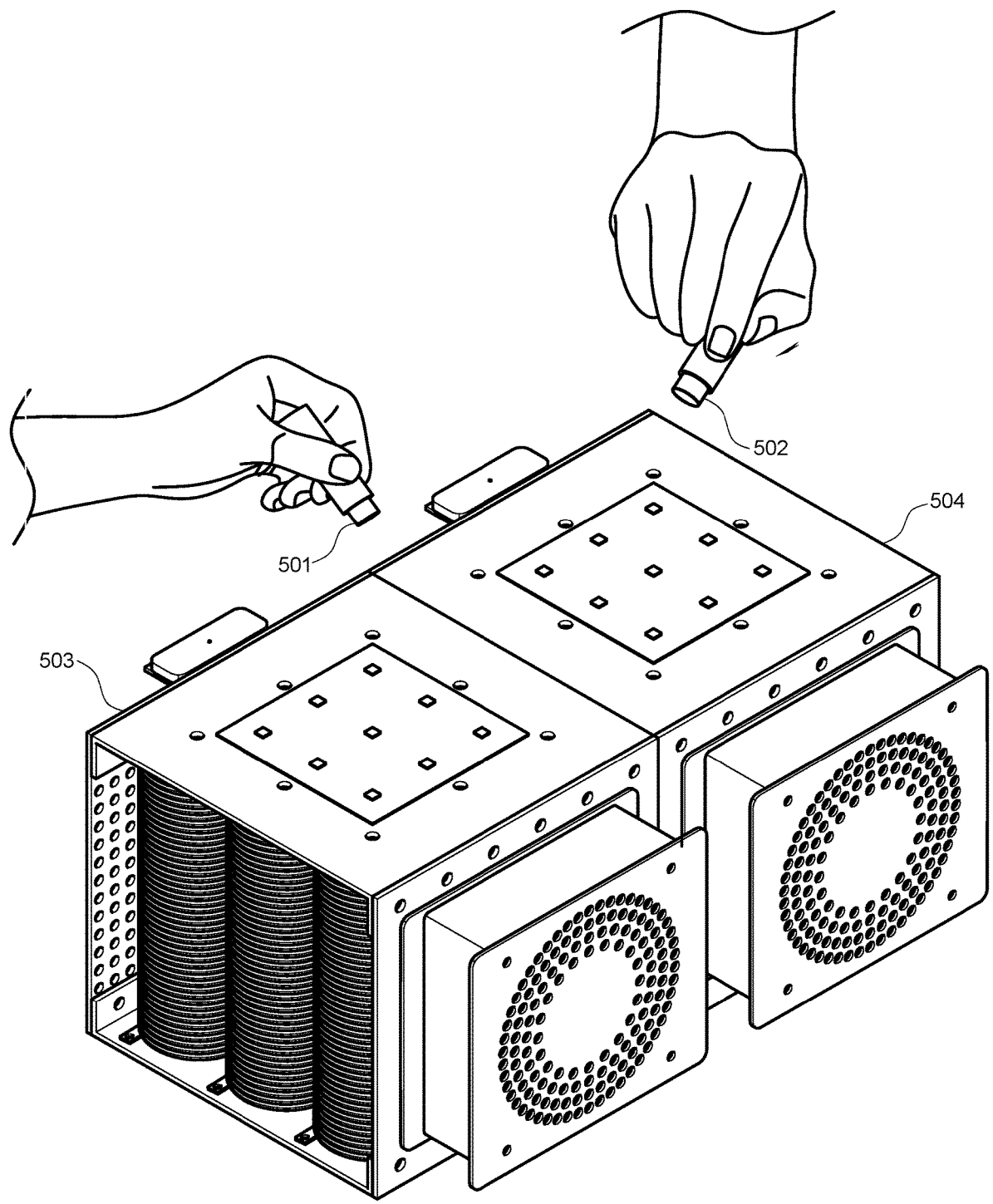
FIG. 5 illustrates the modular configuration feature.

FIG. 5 shows the ability to combine multiple haptic devices 503 and 504 to provide haptic interaction in multiple points 501 and 502 in the common workspace of these devices. This feature can be implemented without any modifications to the hardware but the software of the device. Each device represents a unit cell and provides magnetic forces/torques on a magnetic agent located on the operating workspace, the combination of these cells together enables the user to achieve multi-point haptic interaction over an extended workspace.

The present invention is not limited to the embodiments described above. Various changes and modifications can, of course, be made, without departing from the scope and spirit of the present invention. Additional advantages and modifications will readily occur to those skilled in the art. Accordingly, various modifications may be made without departing from the spirit or scope of the general inventive concept as defined by the appended claims and their equivalents.

It will also be appreciated that such development effort might be complex and time-consuming, but would nevertheless be a routine undertaking for those of ordinary skill in the field of the appropriate art having the benefit of this disclosure. Accordingly, the claims appended hereto are not intended to be limited by the disclosed embodiments but are to be accorded their widest scope consistent with the principles and features disclosed herein.

The present invention can be used for the wireless actuation/localization of untethered magnetic devices such as micro/milli magnetic robots and magnetically-actuated endoscopic capsules.

The proposed device and system have good potential in these fields:

Haptic rendering techniques and algorithms,
Human-computer interaction,
Haptic Interfaces design & control,
Teleoperation,
Augmented/Virtual reality,
Medical training simulators,
Rehabilitation,
Interactive advertisement and interactive kiosks,
Kinesthetic learning, 3D computing interface for disabled people, and
Wireless magnetic actuation of untethered magnetic devices.

What is claimed is:

1. An electromagnetic-based haptic device comprising:
   an array of flat wire coils, each coil being formed around a core selected from a group consisting of ferromagnetic and paramagnetic materials, and each coil having a longitudinal set of packed flat conductive turns, wherein every two turns are separated by an axial air gap;
   a magnetic localization system;
   a cooling fluid source;
   a magnetic agent adapted to be attached to an implement;
   current controllers; and
   a controller and computer-readable memory, the controller being configured to carry out a set of instructions stored in the computer-readable memory to control the device;
   wherein the cooling fluid source is adapted to generate a fluid flow that passes over surfaces of the coils through the axial air gaps to dissipate heat generated by the coils during operation.

2. The electromagnetic-based haptic device of claim 1, wherein the magnetic agent is selected from a group consisting of a permanent magnet, an electromagnet, or a combination thereof.

3. The electromagnetic-based haptic device of claim 1, wherein the magnetic agent is attached to an implement selected from a group consisting of a wearable device and a stylus and/or wherein the haptic device further comprises a magnetic shielding structure manufactured from a ferromagnetic material with high magnetic permeability.

4. The electromagnetic-based haptic device of claim 1, wherein the array of flat wire coil comprises a single layer of conductive turns.

5. The electromagnetic-based haptic device of claim 1, wherein the array of flat wire coil comprises multi-layers of conductive turns.

6. The electromagnetic-based haptic device of claim 1, wherein the array of flat wire coils is movable in three dimensional space.

7. The electromagnetic-based haptic device of claim 1, wherein the array of flat wire coils is formed in a planar configuration.

8. The electromagnetic-based haptic device of claim 1, wherein the magnetic localization system comprises two arrays of three-dimensional magnetic field sensors, mounted symmetrically above and below the array of flat wire coils.

9. The electromagnetic-based haptic device of claim 1, the set of instructions stored in the computer-readable memory comprise instructions for causing the controller to carry out a magnetic localization algorithm that subtracts a measured magnetic field from a first magnetic field sensor array from a measured magnetic field from a second magnetic field sensor array to calculate the change in magnetic field generated by the magnetic agent, and based on this estimates the position and orientation of the magnetic agent in three dimensional space using a non-linear optimization algorithm.

10. The electromagnetic-based haptic device of claim 9, wherein the instructions further comprise an agent localization sensor fusion algorithm configured to fuse data from the magnetic localization algorithm with data from an optical tracking algorithm.

11. The electromagnetic-based haptic device of claim 1, wherein the set of instructions stored in the computer-readable memory comprise instructions for causing the controller to carry out:
   a haptic rendering algorithm; and
   a current control algorithm.

12. The electromagnetic-based haptic device of claim 11, wherein the current control algorithm uses a three-dimensional force and three dimensional torque model for the flat-wire coils and an estimated position and orientation of the magnetic agent to calculate the input currents to the flat wire coils.

13. The electromagnetic-based haptic device of claim 1, wherein the device has a modular configuration, and the controller is further configured to enable combination of multiple of the haptic devices to provide haptic interaction at multiple points within a common workspace.

14. A computer-implemented method for controlling an electromagnetic-based haptic device, the method comprising the steps of:
   implementing a localization algorithm by subtracting a measured magnetic field received from a first magnetic field sensor array from a measured magnetic field from a second magnetic field sensor array to calculate the change in magnetic field generated by a magnetic agent, and based on this estimating the position and orientation of the magnetic agent in three dimensional space;
   implementing a haptic rendering algorithm to calculate a set of force vectors required to render a representation of a virtual object in mid-air based on the geometry of the shape to be rendered and an estimated position and orientation of the magnetic agent as determined by the localization algorithm; and
   implementing a current control algorithm using a three dimensional force and three dimensional torque model for an array of flat-wire coils of the haptic device and an estimated position and orientation of the magnetic agent as determined by the localization algorithm to calculate the input currents to the flat wire coils.

* * * * *